United States Patent
Chen et al.

(10) Patent No.: US 7,863,982 B2
(45) Date of Patent: Jan. 4, 2011

(54) DRIVING CIRCUIT CAPABLE OF ENHANCING RESPONSE SPEED AND RELATED METHOD

(75) Inventors: Ji-Ting Chen, Hsinchu County (TW); Jr-Ching Lin, Kao-Hsiung (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 26 days.

(21) Appl. No.: 12/325,251

(22) Filed: Nov. 30, 2008

(65) Prior Publication Data

US 2010/0013558 A1  Jan. 21, 2010

(30) Foreign Application Priority Data

Jul. 18, 2008  (TW) .............................. 97127320 A

(51) Int. Cl.
*H03F 3/45* (2006.01)
(52) U.S. Cl. ...................................... 330/261; 330/129
(58) Field of Classification Search ................ 330/261, 330/129, 136, 279
See application file for complete search history.

(56) References Cited

U.S. PATENT DOCUMENTS

| | | | |
|---|---|---|---|
| 6,593,812 B2* | 7/2003 | Sundstrom | 330/136 |
| 6,597,898 B1* | 7/2003 | Iwata et al. | 455/240.1 |
| 6,683,496 B2* | 1/2004 | Poggi et al. | 330/132 |
| 6,745,016 B2* | 6/2004 | Iwata et al. | 455/234.1 |
| 7,339,430 B2* | 3/2008 | Chiu | 330/253 |
| 7,372,329 B1* | 5/2008 | Tan | 330/253 |

* cited by examiner

*Primary Examiner*—Henry K Choe
(74) *Attorney, Agent, or Firm*—Winston Hsu; Scott Margo

(57) ABSTRACT

A driving circuit of enhancing response speed is disclosed. The driving circuit includes an operational amplifier and a slew rate enhancement unit. The operational amplifier is utilized for generating a driving voltage according to an input voltage. The slew rate enhancement unit is coupled to the operational amplifier, and is utilized for generating a compensation current to the operational amplifier to enlarge a bias current of the operational amplifier according to voltage difference between the input voltage and the driving voltage when variation of the input voltage occurs.

21 Claims, 9 Drawing Sheets

DRIVING CIRCUIT CAPABLE OF ENHANCING RESPONSE SPEED AND RELATED METHOD

BACKGROUND OF THE INVENTION

1. Field of the Invention

The present invention relates to a driving circuit capable of enhancing response speed and related method, and more particularly, to a driving circuit and related method that dynamically increases an input stage bias current of an operational amplifier for enhancing response speed of the operational amplifier according to a voltage difference between an input voltage and output voltage of the operational amplifier.

2. Description of the Prior Art

An operational amplifier is a widely used element for realizing a variety of circuit functions. Taking driving circuits of a liquid crystal display (LCD) for example, the operational amplifier can be used as an output buffer, which charges or discharges loading ends, i.e. liquid crystals, according to analog signals outputted by a front stage digital to analog converter (DAC), for driving corresponding pixel units on the LCD. However, with increases in size and resolution of the LCD, data quantity processed by the driving circuits per unit of time is also increasing significantly, so that response speed of the operational amplifier, also called slew rate, has to be enhanced as well.

In a conventional driver chip, the operational amplifier generally has a two-stage structure, which includes a first stage amplification circuit (input stage) and a second stage output circuit (output stage). The first stage amplification circuit is utilized for increasing current or voltage gain of the operational amplifier, while the second stage output circuit is utilized for driving capacitive or resistive loads connected to the operational amplifier. In addition, since the operational amplifier may suffer loop instability problems, Miller compensation capacitors are commonly implemented to perform frequency compensation for improving loop stability.

Please refer to FIG. 1. FIG. 1 is a schematic diagram of a conventional operational amplifier 100. The operational amplifier 100 is a rail-to-rail operational amplifier and includes an input stage 110 and an output stage 120. The input stage 110 includes an N-type differential pair 112 and a P-type differential pair 114. The N-type differential pair 112 is formed by matched NMOS transistors MN1, MN2 and a bias transistor MN3. The bias transistor MN3 is coupled to source electrodes of the NMOS transistors MN1, MN2, and is utilized for providing a fixed static current (or driving current) to the N-type differential pair 112. Similarly, the P-type differential pair 114 is formed by matched PMOS transistors MP1, MP2 and a bias transistor MP3. The bias transistor MN3 is coupled to source electrodes of the PMOS transistors MP1, MP2, and is utilized for providing a fixed driving current to the P-type differential pair 114. In addition, the input stage 110 further includes a first current mirror 130, a second current mirror 140 and a third current mirror 150. The first current mirror 130 and the second current mirror 140 are indicated by current source symbols IP5, IP6 and current source symbols IN5, IN6, and utilized as active loads of the N-type differential pair 112 and the P-type differential pair 114, respectively. The third current mirror 150 is indicated by current source symbols 17, 18, and is utilized for summing up signals of the N-type differential pair 112 and the P-type differential pair 114 to output to the output stage 120.

The output stage circuit 120 is a class AB push-pull output circuit formed by transistors MP9 and MN9, in which an output terminal AVO of the output stage circuit 120 is coupled to an input terminal AVN of the input stage 110 for forming an output buffer with unit gain and negative feedback configuration. In addition, the operational amplifier 100 further includes compensation capacitors CM1 and CM2, placed between the input stage 110 and the output stage circuit 120, for performing pole-splitting for output signals of the input stage 110 and the output stage 120, so as to enhance loop stability. Detailed operation of the operational amplifier 100 is well-known by those skilled in the art, and not narrated herein.

Generally, the response speed of the operational amplifier 100 is decided by the bias currents of the input stage and the output stage. However, in order to drive external loads of the operational amplifier 100, the output stage driving current is generally greater than the input stage bias current. In this situation, the response speed of the operational amplifier 100 may be restricted by, or depend on, how fast the input stage bias current charges or discharges the compensation capacitors CM1, CM2, and can be expressed by the following slew rate equation:

$$SR = \frac{I}{C} = \frac{\Delta V}{t},$$

in which "I" indicates a bias current provided by the transistor MN3 or MP3, "C" indicates capacitance of the compensation capacitors CM1 or CM2, and "ΔV" indicates voltage variation of the output terminal AVO. Thus, it can be seen that when the bias current of the input stage 110 is increased, the compensation capacitors can be charged or discharged much faster, so the response speed of the operational amplifier 100 can be enhanced as well.

Thus, in the prior art, the internal slew rate of the operational amplifier is generally enhanced by increasing the bias current of the input stage circuit. However, this not only increases circuit area, e.g. by increasing layout area of the bias transistors, but also causes additional power consumption of the operational amplifier.

SUMMARY OF THE INVENTION

It is therefore an objective of the present invention to provide a driving circuit capable of enhancing response speed and related method.

According to the present invention, a driving circuit capable of enhancing response speed is disclosed. The driving circuit includes an operational amplifier and a slew rate enhancement unit. The operational amplifier is utilized for generating a driving voltage according to an input voltage. The slew rate enhancement unit is coupled to the operational amplifier, and is utilized for generating a compensation current to the operational amplifier to enlarge a bias current of the operational amplifier according to a voltage difference between the input voltage and the driving voltage when variation of the input voltage occurs.

According to the present invention, a method of enhancing response speed of an operation amplifier is further disclosed. The operational amplifier is utilized for generating a driving voltage according to an input voltage. The method includes steps of receiving the input voltage and the driving voltage, and generating a compensation current to the operational amplifier to enlarge a bias current of the operational amplifier according to a voltage difference between the input voltage and the driving voltage when variation of the input voltage occurs.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
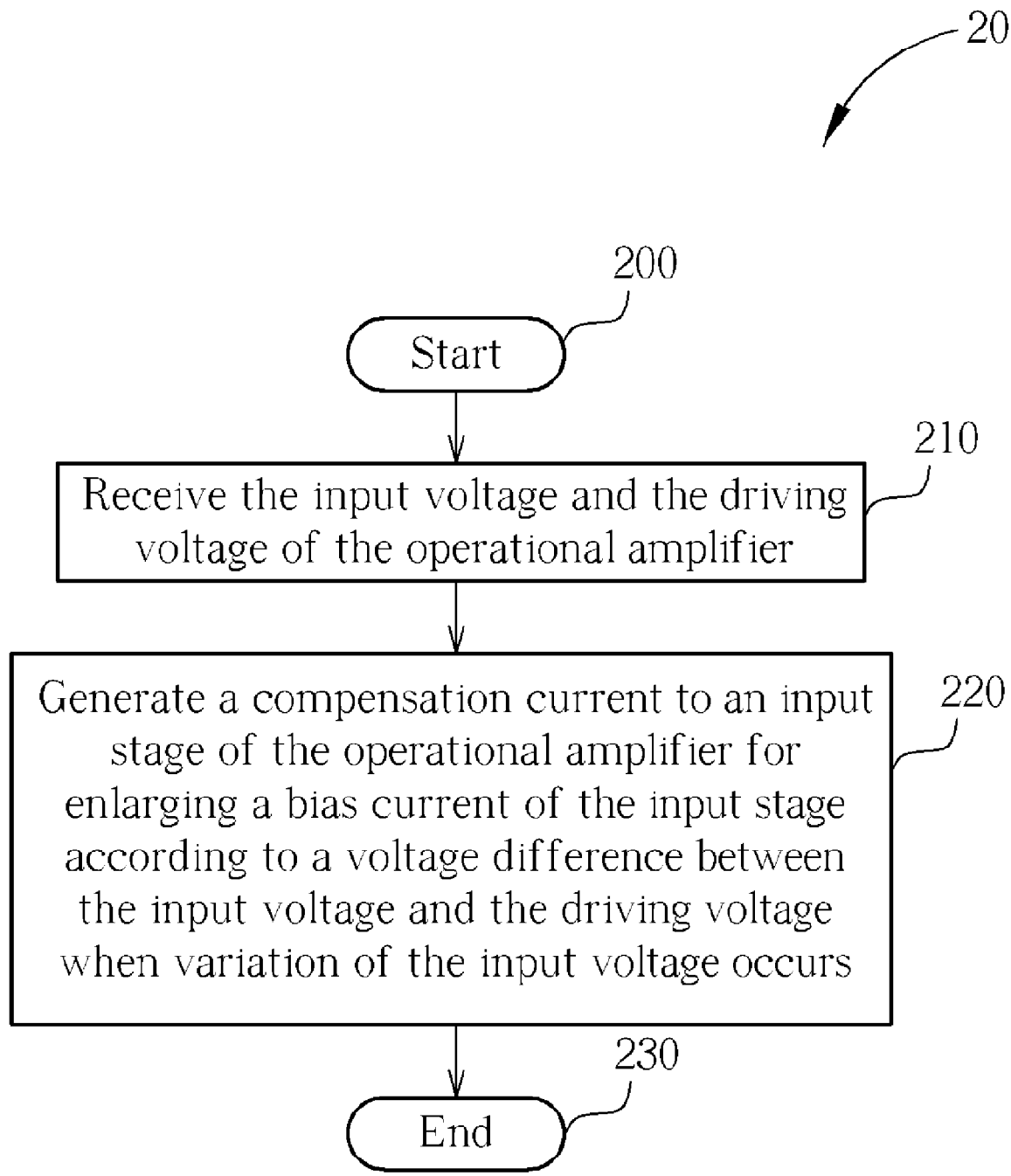
FIG. 2 is a schematic diagram of a process of enhancing response speed of an operation amplifier according to the present invention.

Please refer to FIG. 2. FIG. 2 is a schematic diagram of a process 20 of enhancing response speed of an operational amplifier according to an embodiment of the present invention. Preferably, the process 20 is applied for an operational amplifier with a feedback configuration. The operational amplifier is generally utilized for generating an input voltage according to a driving voltage. The process 20 includes the following steps:

Step 200: Start.

Step 210: Receive the input voltage and the driving voltage of the operational amplifier.

Step 220: Generate a compensation current to an input stage of the operational amplifier for enlarging a bias current of the input stage according to a voltage difference between the input voltage and the driving voltage when variation of the input voltage occurs.

Step 230: End.

According to the process 20, when the input voltage of the operational amplifier varies, the compensation current is generated to the input stage of the operational amplifier for enlarging the bias current of the input stage according to the voltage difference between the input voltage and the driving voltage, so as to enhance interior driving capability of the operational amplifier. That means, in the embodiment of the present invention, the bias current of the input stage is dynamically increased for enhancing the response speed of the operational amplifier according to the voltage difference between the input voltage and the driving voltage of the operational amplifier. In addition, the compensation current is generated only when variation of the input voltage occurs, and thus there is no extra power consumed in a static state by the operational amplifier of the present invention.

Figure 3:
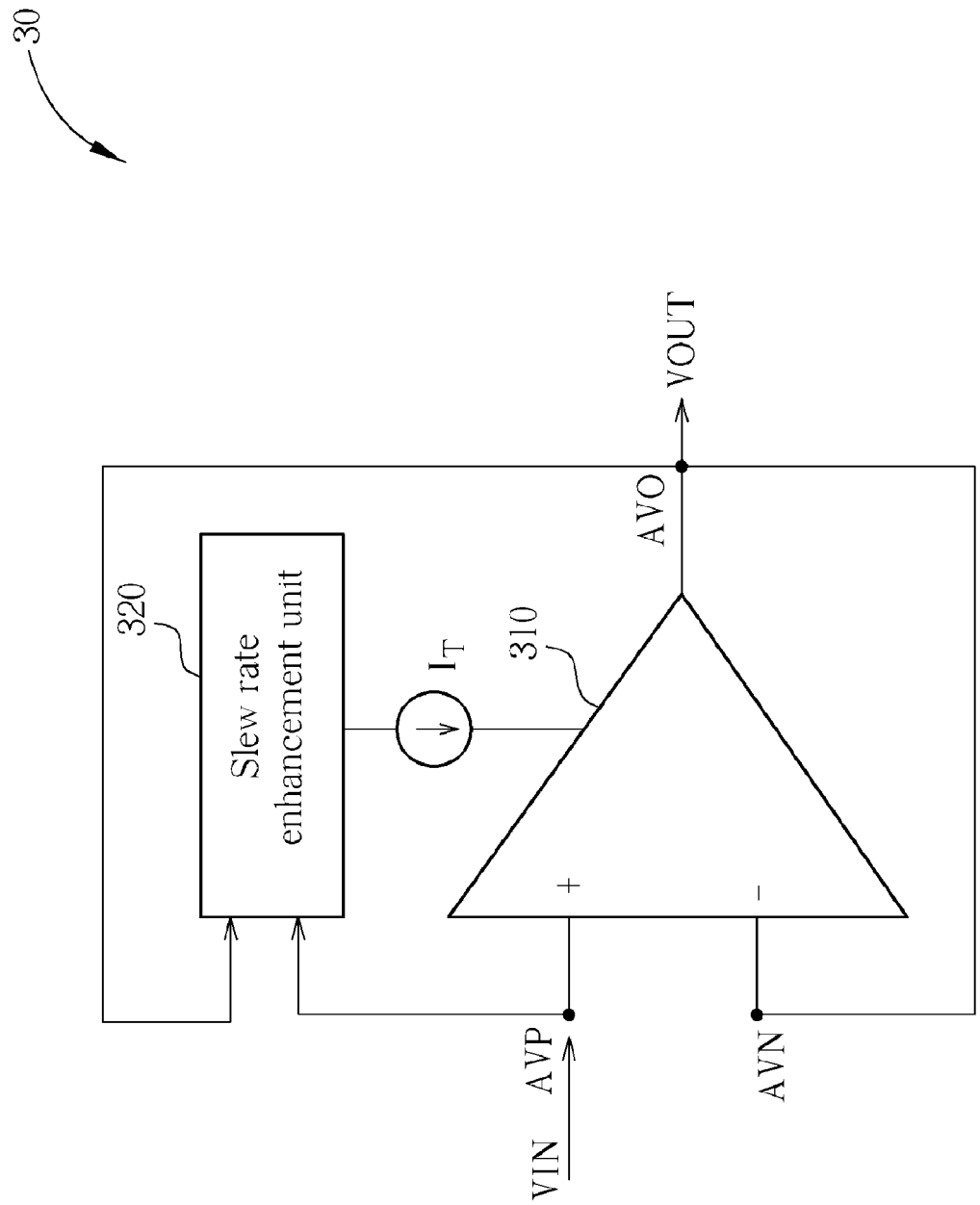
FIG. 3 is a schematic diagram of a driving circuit capable of enhancing response speed according to the present invention.

Please refer to FIG. 3. FIG. 3 is a schematic diagram of a driving circuit 30 capable of enhancing response speed according to the embodiment of the present invention. The driving circuit 30 is utilized for realizing the process 20, and includes an operational amplifier 310 and a slew rate enhancement unit 320. The operational amplifier 310 has an output terminal AVO coupled to a negative input terminal AVN, i.e. a negative feedback connection, and is utilized for generating a driving voltage VOUT according to an input voltage VIN received by a positive input terminal AVP. The slew rate enhancement unit 320 is coupled to the positive input terminal AVP and the output terminal AVO of the operational amplifier 310, and is utilized for generating a compensation current $I_T$ to an input stage of the operational amplifier 310 for enlarging a bias current of the input stage according to a voltage difference between the input voltage VIN and the driving voltage VOUT when variation of the input voltage VIN occurs.

As mentioned previously, the response speed of the operational amplifier is usually restricted by the bias current of the input stage. Thus, when the input voltage of the operational amplifier varies, the driving circuit 30 of the present invention can generate the extra compensation current to the operational amplifier for increasing the bias current of the input stage instantaneously, so as to increase the response speed of the operational amplifier. In addition, the compensation current is generated only when variation of the input voltage occurs, and thus there is no extra power consumed in the static state by the operational amplifier of the present invention.

Figure 1:
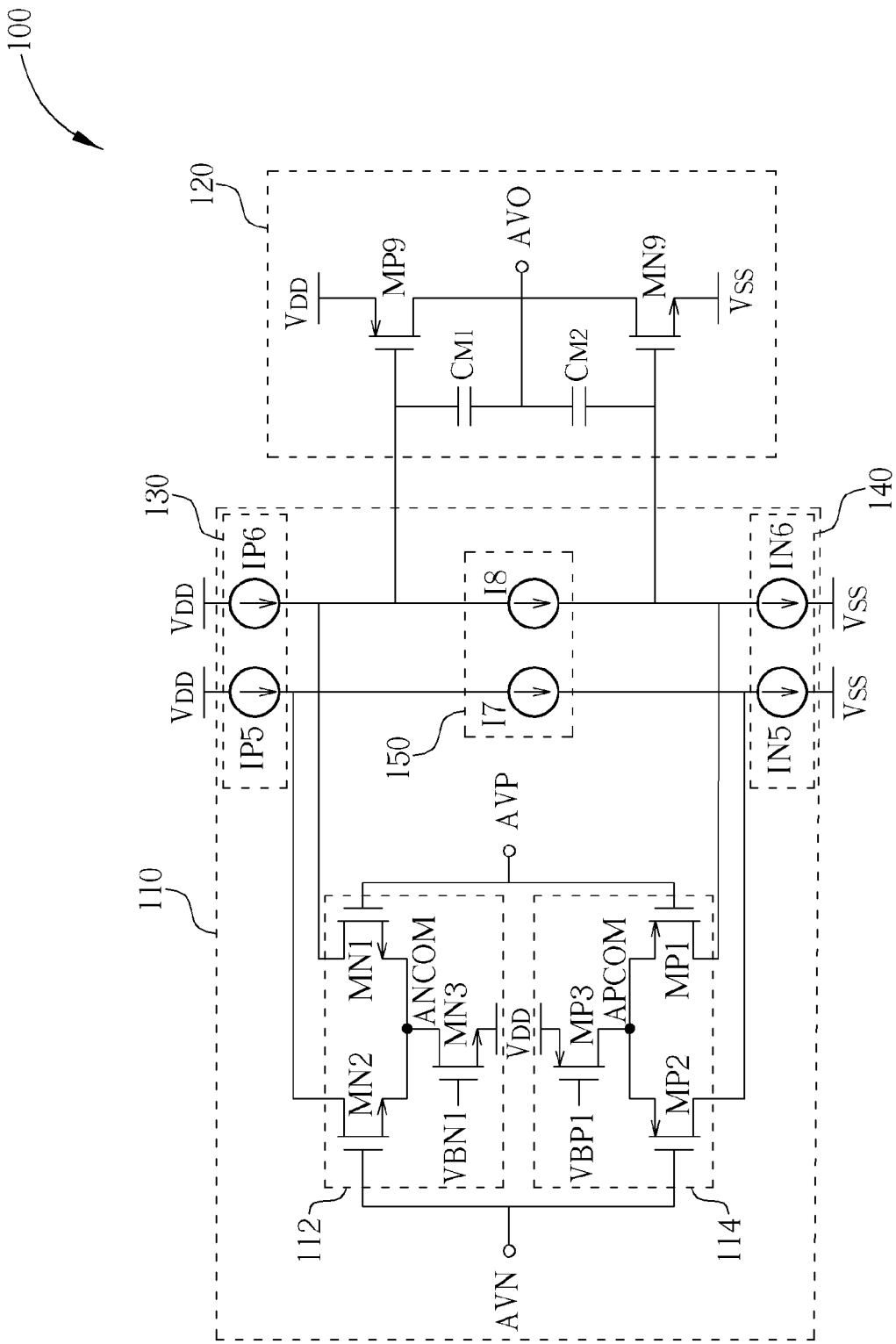
FIG. 1 is a schematic diagram of a conventional operational amplifier.

Preferably, the operational amplifier 310 can be realized by a rail-to-rail operational amplifier similar to that shown in FIG. 1. In this case, the compensation current $I_T$ can be selectively outputted to a bias current input terminal of the P-type differential pair (e.g. the node APCOM in FIG. 1) or to a bias current input terminal of the N-type differential pair (e.g. the node ANCOM in FIG. 1) according to variation status of the input voltage VIN.

Figure 4:
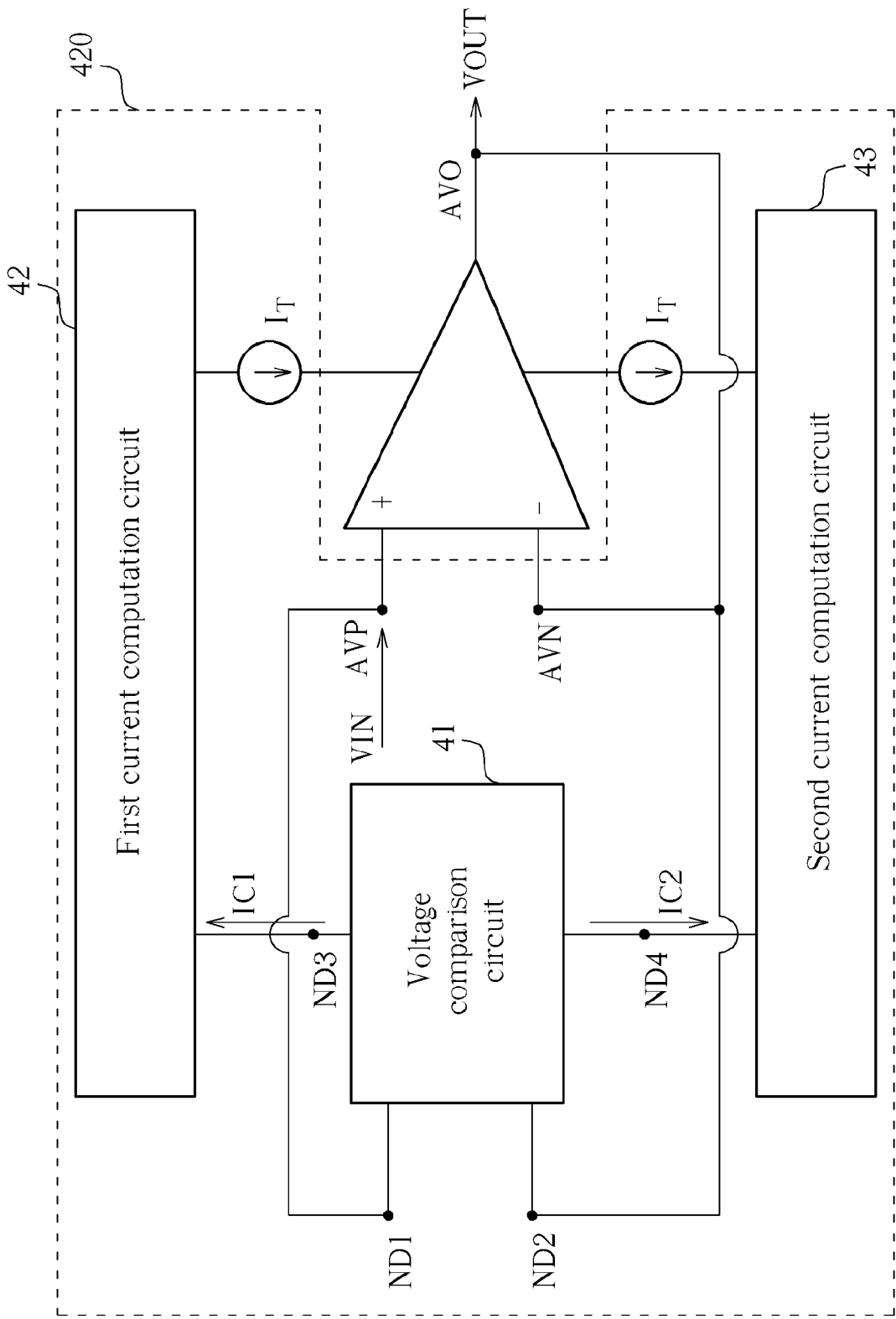
FIG. 4 is a schematic diagram of a driving circuit according to an embodiment of the present invention.

For example, please refer to FIG. 4, which shows an embodiment of the driving circuit 30 of the present invention. As shown in FIG. 4, the slew rate enhancement unit 420 includes a voltage comparison circuit 41, a first current computation circuit 42 and a second current computation circuit 43. The voltage comparison circuit 41 has a first input terminal ND1 coupled to the positive input terminal AVP of the operational amplifier, a second input terminal ND2 coupled to the output terminal AVO of the operational amplifier, a first output terminal ND3 and a second output terminal ND4, and is utilized for comparing the input voltage VIN and the driving voltage VOUT to generate a first control signal IC1 to the first output terminal ND3 according to a voltage difference between the input voltage VIN and the driving voltage VOUT when the input voltage VIN is greater than the driving voltage VOUT, or to generate a second control signal IC2 to the second output terminal ND4 according to the voltage difference between the input voltage VIN and the driving voltage VOUT when the input voltage VIN is less than the driving voltage VOUT. The first current computation circuit 42 is coupled to the first output terminal ND3 of the voltage comparison circuit 41, and is utilized for performing current computation to generate the compensation current $I_T$ to the bias current input terminal of the P-type differential pair according to the first control signal IC1. The second current computation circuit 43 is coupled to the second output terminal ND4 of the voltage comparison circuit 41, and is utilized for performing current computation to generate the compensation current $I_T$ to the bias current input terminal of the N-type differential pair according to the second control signal IC2.

Therefore, when the input voltage VIN of the operational amplifier varies, the driving circuit 30 can generate the compensation current $I_T$ to the bias current input terminal of the P-type differential pair or to the bias current input terminal of the N-type differential pair according to the voltage difference between the input voltage and the driving voltage, so as to increase the response speed of the operational amplifier. Detailed operation of the slew rate enhancement unit 420 is described in the following.

Figure 5:
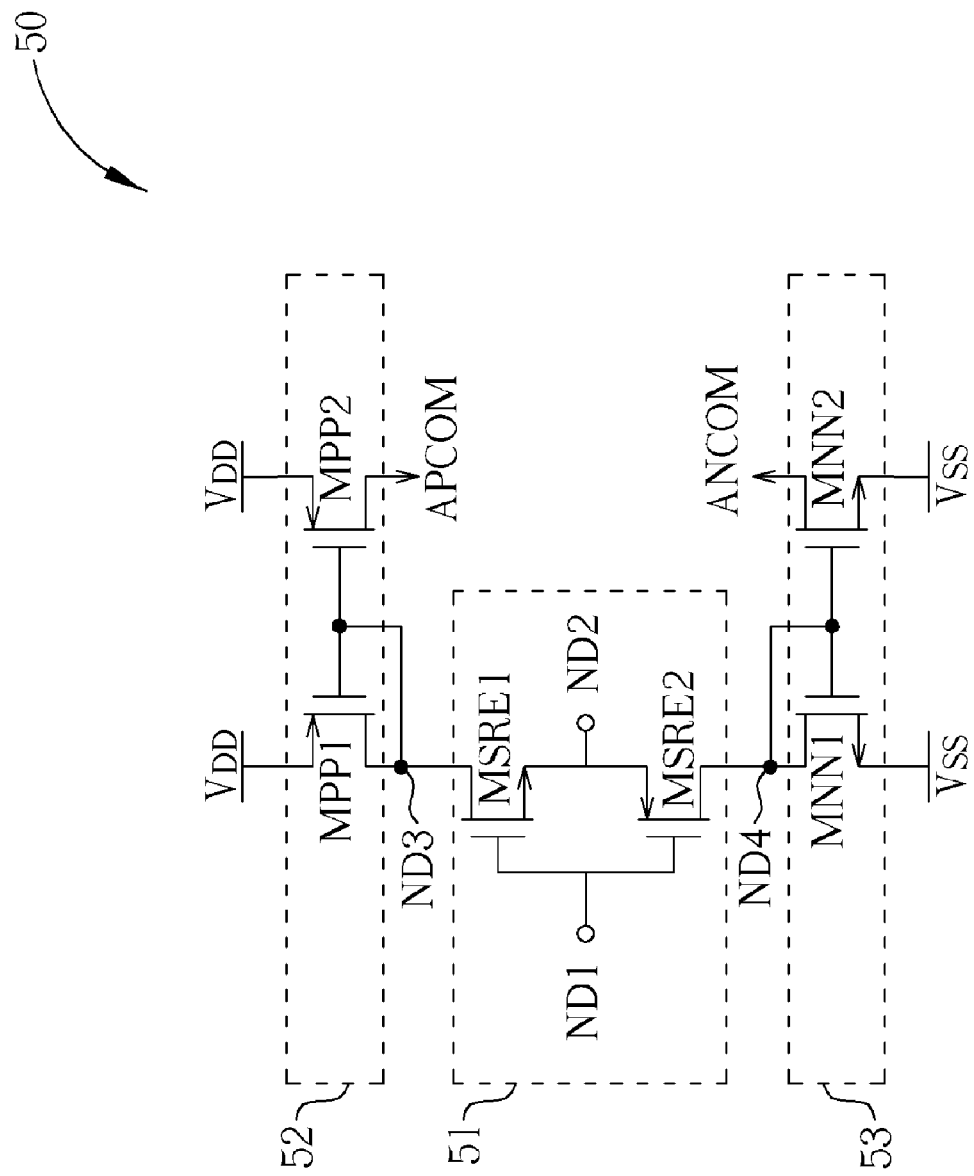
FIG. 5 is a schematic diagram of a slew rate enhancement unit according to an embodiment of the present invention.

Please refer to FIG. 5. FIG. 5 is a schematic diagram of a slew rate enhancement unit 50 according to an embodiment of the present invention. The slew rate enhancement unit 50 is utilized for realizing the slew rate enhancement unit 420 of FIG. 4, and includes a voltage comparison circuit 51, a first current computation circuit 52 and a second current computation circuit 53. The voltage comparison circuit 51 comprises series-connected NMOS transistor MSRE1 and PMOS transistor MSRE2, in which gate electrodes of the NMOS transistor MSRE1 and the PMOS transistor MSRE2 are coupled to the positive input terminal AVP of the operational amplifier via the first input terminal ND1, source electrodes of the NMOS transistor MSRE1 and the PMOS transistor MSRE2 are coupled to the output terminal AVO of the operational amplifier via the second input terminal ND2, and drain electrodes of the NMOS transistor MSRE1 and the PMOS transistor MSRE2 are respectively coupled to the first output terminal ND3 and the second output terminal ND4 of the voltage comparison circuit 51. The first current computation circuit 52 and the second current computation circuit 53 are current mirror circuits formed by PMOS transistors MPP1, MPP2 and NMOS transistors MNN1, MNN2, respectively, and are utilized for performing "copy" operations on current signals of the first output terminal ND3 and the second output terminal ND4 to output to the bias current input terminal APCOM of the P-type differential pair and the bias current input terminal ANCOM of the N-type differential pair, as shown in FIG. 4.

For illustrating operations of the slew rate enhancement unit 50 more clearly, please refer to FIG. 1, FIG. 4 and FIG. 5 simultaneously. When the input voltage of the operational amplifier is raised, the input voltage will be greater than the outputted driving voltage at this time, so the transistor MSRE1 is turned on to draw a current, i.e. the first control signal IC1, from the transistor MPP1 according to the voltage difference between the input voltage and the driving voltage. Then, the current mirror formed by the PMOS transistors MPP1, MPP2 further performs current computation to generate the compensation current $I_T$ to the bias current input terminal APCOM of the P-type differential pair according to the first control signal IC1. On the other hand, from the standpoint of the operational amplifier, since a voltage level of the input terminal AVP is raised instantly, causing the PMOS transistor MP1 to be turned off, the compensation current $I_T$ generated by the slew rate enhancement unit 50 may all flow into the current source IN5 via the PMOS transistor MP2. However, the current sources IN5 and IN6 are also a current mirror, and thus the compensation current $I_T$ also increases a current sink capability of the current source IN6 that draws currents from the compensation capacitors CM1 and CM2.

In this case, the response speed of the operational amplifier can be expressed by the following slew rate equation:

$$SR = \frac{I'}{C} = \frac{\Delta V'}{t},$$

in which "I'" indicates a sum of the bias current provided by the transistor MN3, MP3 and the compensation current $I_T$ generated by the slew rate enhancement unit 50, "C" indicates capacitance of the compensation capacitors CM1, CM2, and "ΔV'" indicates voltage variation of the output terminal AVO.

As is well-known by those skilled in the art, the turn-on resistance of a transistor is determined by its gate-to-source voltage $V_{GS}$, so a magnitude of the compensation current $I_T$ generated by the slew rate enhancement unit 50 is governed by the voltage difference between the input voltage and the driving voltage of the operational amplifier.

Thus, it can be seen that when the voltage difference between the input voltage and the driving voltage is increased, the compensation current $I_T$ generated by the slew rate enhancement unit 50 is also increased to increase the charging or discharging speed of the compensation capacitors CM1 and CM2, so as to enhance the response speed of the operational amplifier. Conversely, when the voltage difference is decreased due to the driving voltage catching up with the variation of the input voltage, the compensation current $I_T$ generated by the slew rate enhancement unit 50 is also decreased until the voltage difference is less than the threshold voltage of the transistor MSRE1, which causes the transistor MSRE1 to be turned off. In this situation, the slew rate enhancement unit 50 no longer generates the compensation current to perform the slew rate enhancement operation, so the operational amplifier resumed a normal operation condition.

In like manner, when the input voltage of the operational amplifier is lowered, the compensation current $I_T$ is then generated by the transistor MSRE2 to the bias current input terminal ANCOM of the N-type differential pair for the slew rate enhancement operation, which is not narrated again herein.

Figure 6:
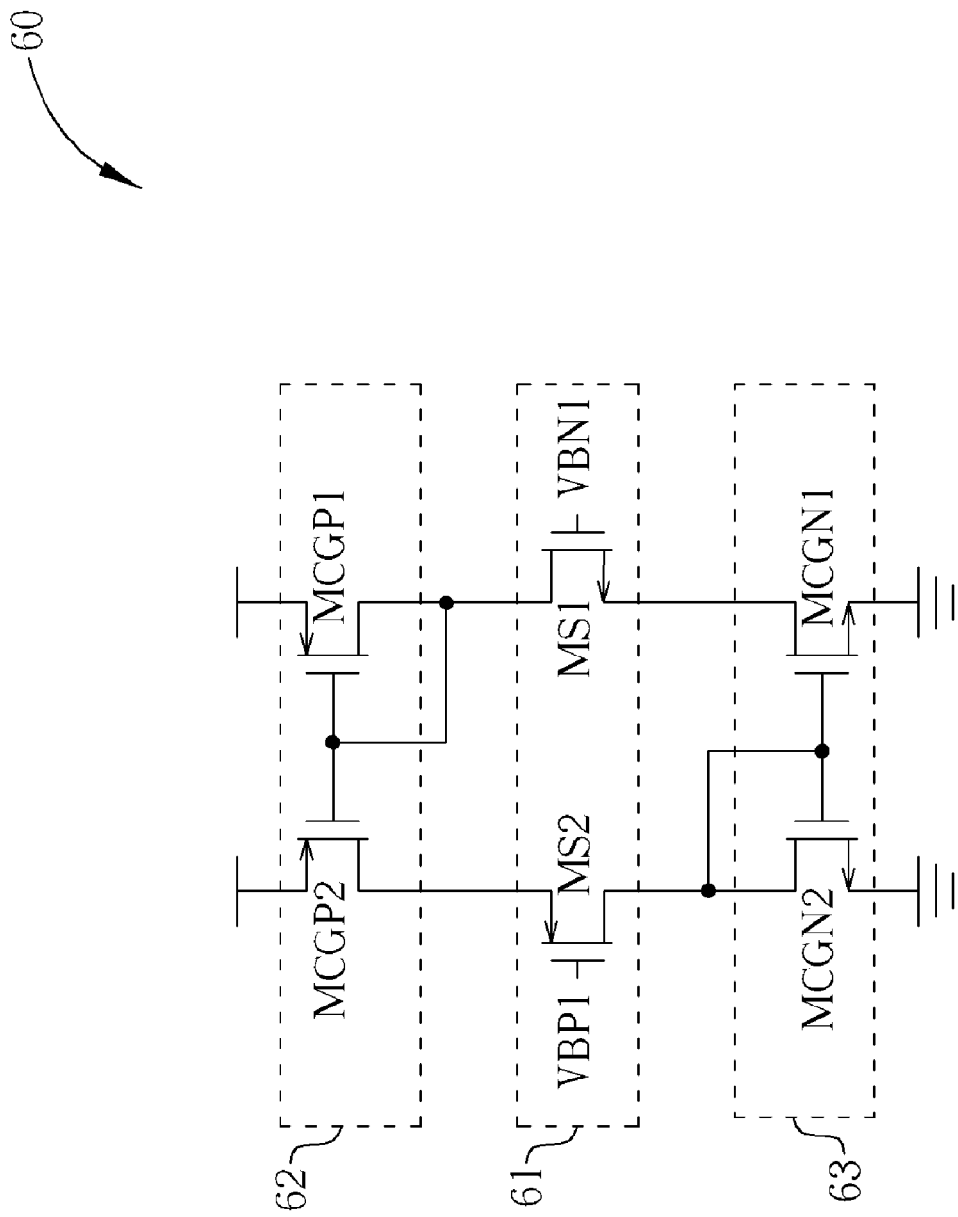
FIG. 6 is a schematic diagram of a conventional constant-Gm circuit.

Please note that the above-mentioned embodiment of the slew rate enhancement unit 50 is merely an exemplary illustration of the present invention, and that those skilled in the art can certainly make appropriate modifications according to practical demands. For example, the slew rate enhancement unit 50 can further be combined with a conventional constant-Gm circuit for reducing the number of transistors required by the operational amplifier, so as to save circuit area of the driving circuit. First, please refer to FIG. 6. FIG. 6 is a schematic diagram of a conventional constant-Gm circuit 60. The constant-Gm circuit 60 is generally built inside the operational amplifier, and is utilized for providing a fixed transconductance value for avoiding a gain value of the operational amplifier being affected by variation of processes, temperatures and supply voltages. In general, the constant-Gm circuit 60 includes a switch circuit 61, a first current mirror 62 and a second current mirror 63, in which the switch circuit 61 is utilized for controlling operation of the constant-Gm circuit 60. Detailed operation of the constant-Gm circuit 60 is well-know by those skilled in the art, and not described herein.

Figure 7:
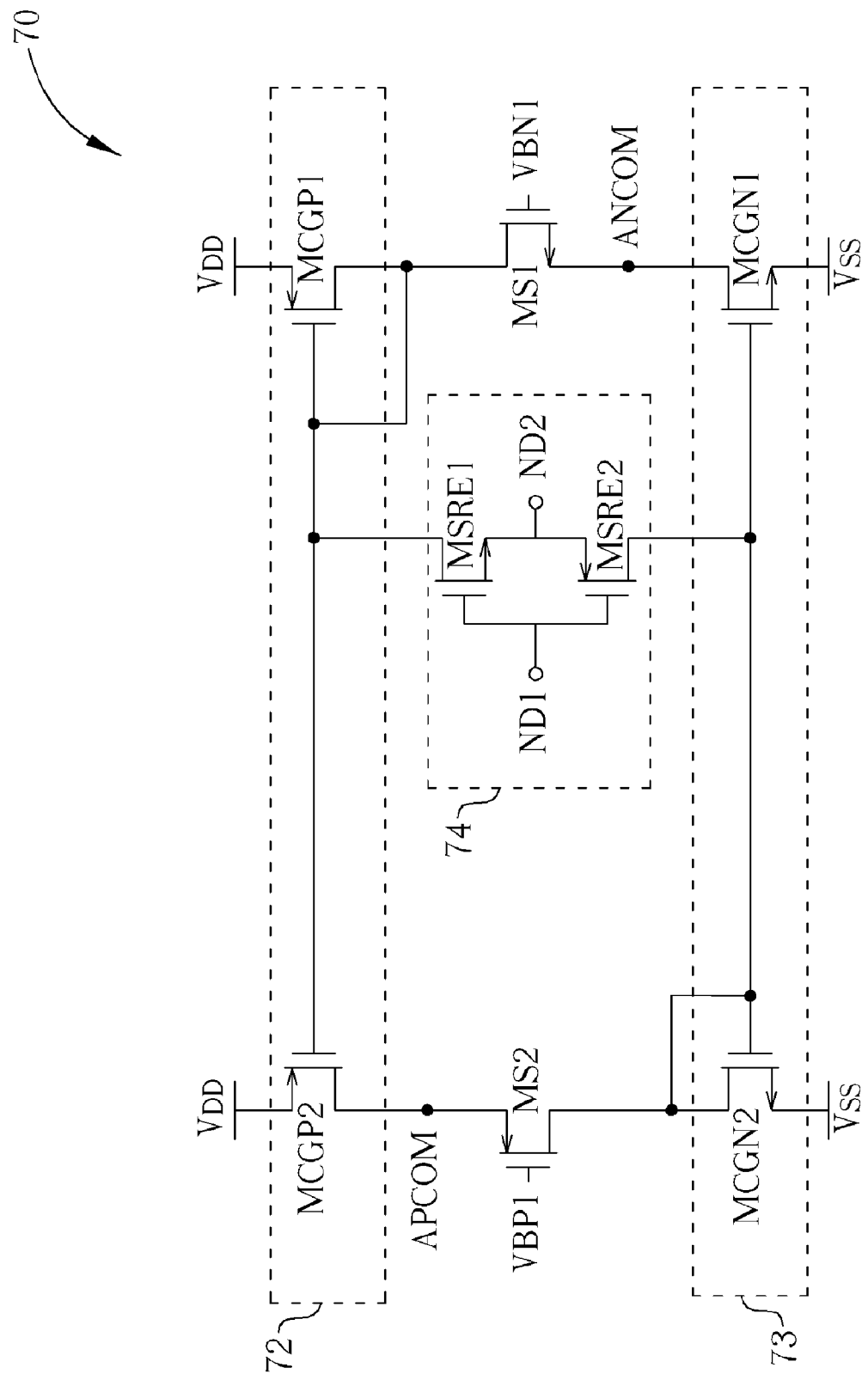
FIG. 7 to FIG. 9 is schematic diagrams of a slew rate enhancement unit according to another embodiment of the present invention.

Please further refer to FIG. 7, which shows another embodiment of the slew rate enhancement unit of the present invention. Compared with the conventional constant-Gm circuit 60, a voltage comparison circuit 74 formed by transistors MSRE1 and MSRE2 is added between a first current mirror 72 and a second current mirror in the present invention, so as to achieve the purpose of enhancing the response speed of the operational amplifier by using the least number of transistors. Related operation is also similar to the slew rate enhancement unit 50, and is not narrated again herein.

Figure 8:
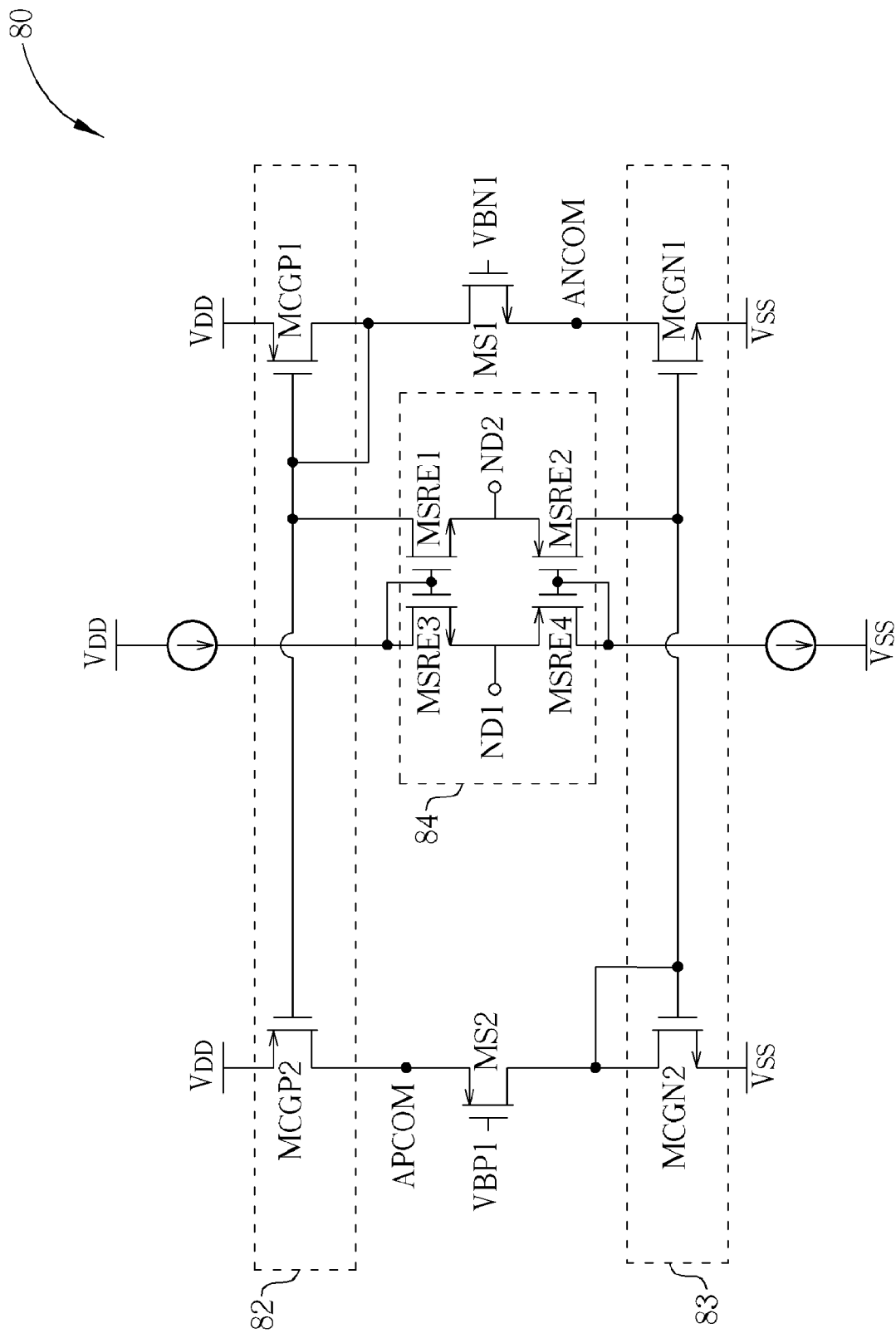
Figure 9:
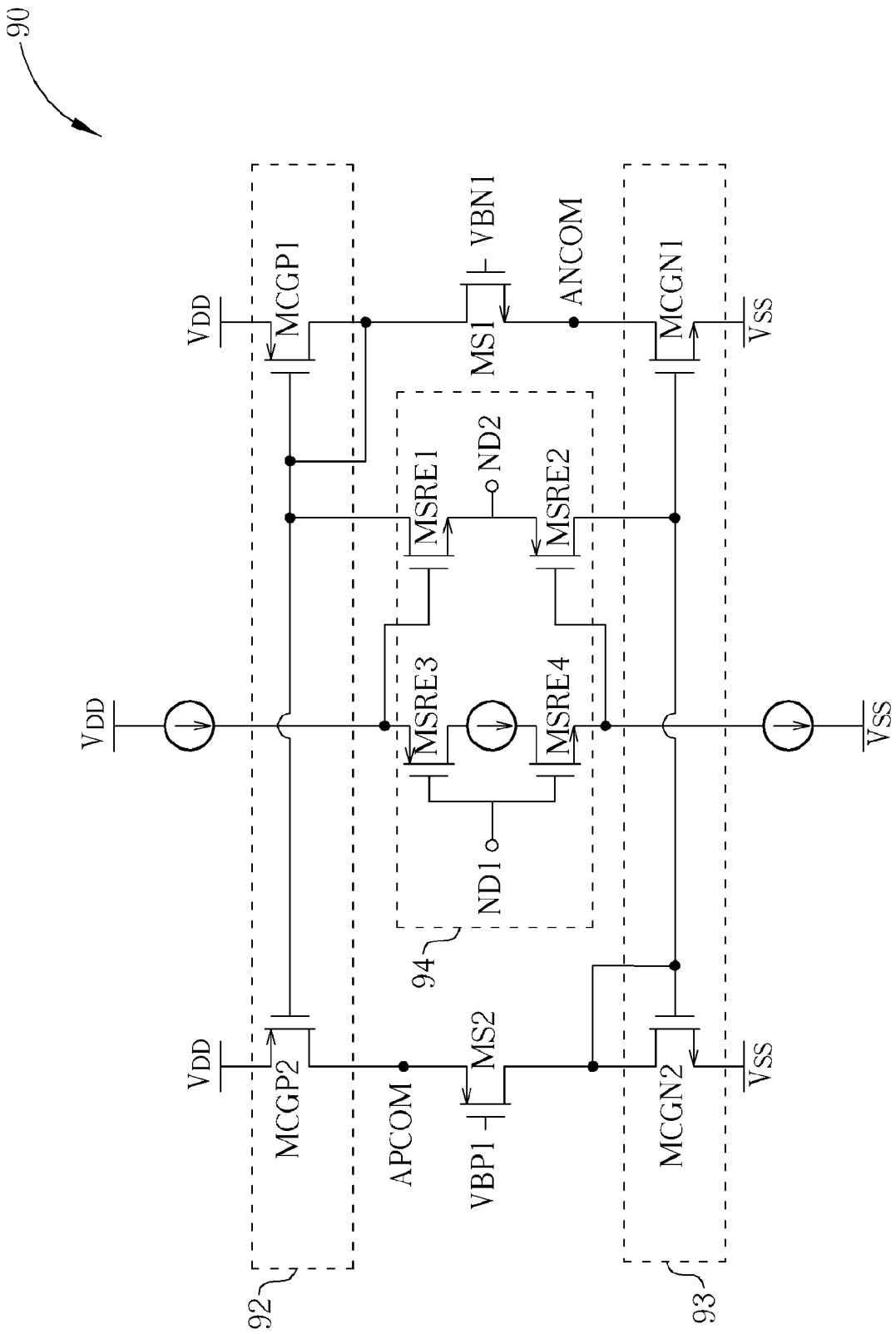

In addition, when the voltage difference between the input voltage and the driving voltage of the operational amplifier is less than the threshold voltage of the transistor, the compensation current is no longer generated by the above slew rate enhancement unit to stop the slew rate enhancement operation. In this case, body effect compensation can further be employed in the present invention to prevent the slew rate enhancement unit from being restricted by the threshold voltage of the transistor, so the slew rate enhancement operation can be stopped when the driving voltage is equal to the input voltage. Please refer to FIG. 8 and FIG. 9, which are further embodiments of the slew rate enhancement unit of the present invention. Compared with the slew rate enhancement unit 70, voltage comparison units 84, 94 respectively utilize two gate-coupled transistors or two matched MOS transistors to realize the body effect compensation, so as to avoid the slew rate enhancement operation being affected by the transistor threshold voltages.

As mentioned above, when the input voltage of the operational amplifier varies, the driving circuit of the present invention can generate the compensation current to the operational amplifier for instantaneously increasing the bias current of the input stage, so as to increase the response speed of the operational amplifier. In addition, the compensation current is generated only when variation of the input voltage occurs, and thus there is no extra power consumed in static state by the operational amplifier of the present invention.

Those skilled in the art will readily observe that numerous modifications and alterations of the device and method may be made while retaining the teachings of the invention.

What is claimed is:

1. A driving circuit capable of enhancing response speed comprising:
    an operational amplifier for generating a driving voltage according to an input voltage; and
    a slew rate enhancement unit, coupled to the operational amplifier, for adjusting operating characteristics of the operational amplifier by generating a compensation current to the operational amplifier to enlarge a bias current of the operational amplifier according to a voltage difference between the input voltage and the driving voltage when variation of the input voltage occurs.

2. The driving circuit of claim 1, wherein the operational amplifier is a rail-to-rail operational amplifier, and comprises a P-type differential pair and an N-type differential pair.

3. The driving circuit of claim 2, wherein the slew rate enhancement unit generates the compensation current to the P-type differential pair to enlarge a bias current of the P-type differential pair according to the voltage difference between the input voltage and the driving voltage when the input voltage rises.

4. The driving circuit of claim 2, wherein the slew rate enhancement unit generates the compensation current to the N-type differential pair to enlarge a bias current of the N-type differential pair according to the voltage difference between the input voltage and the driving voltage when the input voltage descends.

5. The driving circuit of claim 2, wherein the slew rate enhancement unit comprises:
    a voltage comparison circuit, having a first input terminal coupled to the input voltage, a second input terminal coupled to the driving voltage, a first output terminal and a second output terminal, for comparing the input voltage and the driving voltage to generate a first control signal to the first output terminal according to the voltage difference between the input voltage and the driving voltage when the input voltage is greater than the driving voltage, or to generate a second control signal to the second output terminal according to the voltage difference between the input voltage and the driving voltage when the input voltage is less than the driving voltage;
    a first current computation circuit, coupled to the first output terminal of the voltage comparison circuit, for performing a current computation to generate the compensation current to the P-type differential pair for enlarging the bias current of the P-type differential pair according to the first control signal; and
    a second current computation circuit, coupled to the second output terminal of the voltage comparison circuit, for performing a current computation to generate the compensation current to the N-type differential pair for enlarging the bias current of the N-type differential pair according to the second control signal.

6. The driving circuit of claim 5, wherein the voltage comparison circuit comprises:
    an NMOS transistor having a gate electrode coupled to the first input terminal, a source electrode coupled to the second input terminal, and a drain electrode coupled to the first output terminal; and
    a PMOS transistor having a gate electrode coupled to the first input terminal, a source electrode coupled to the second input terminal, and a drain electrode coupled to the second output terminal.

7. The driving circuit of claim 5, wherein the first current computation circuit is a current mirror, and comprises:
    an input terminal, coupled to the first output terminal of the voltage comparison circuit;
    an output terminal, coupled to a bias current reception terminal of the P-type differential pair;
    a first PMOS transistor having a source electrode coupled to a supply voltage, a drain electrode coupled to the input terminal, and a gate electrode coupled to the input terminal; and
    a second PMOS transistor having a source electrode coupled to the supply voltage, a drain electrode coupled to the output terminal, and a gate electrode coupled to the input terminal.

8. The driving circuit of claim 5, wherein the second current computation circuit is a current mirror, and comprises:
    an input terminal, coupled to the second output terminal of the voltage comparison circuit;
    an output terminal, coupled to a bias current reception terminal of the N-type differential pair;
    a first NMOS transistor having a source electrode coupled to a ground voltage, a drain electrode coupled to the input terminal and a gate electrode coupled to the input terminal; and
    a second NMOS transistor having a source electrode coupled to the ground voltage, a drain electrode coupled to the output terminal and a gate electrode coupled to the input terminal.

9. The driving circuit of claim 5, wherein the operational amplifier further comprise a constant-Gm circuit, the constant-Gm circuit comprising a third current mirror, a fourth current mirror and a switch circuit, the third current mirror and the fourth current mirror formed by PMOS transistors and NMOS transistors, respectively.

10. The driving circuit of claim 9, wherein the first current computation circuit and the second current computation circuit of the slew rate enhancement unit are the third current mirror and the fourth current mirror of the constant-Gm circuit, respectively.

11. The driving circuit of claim 1, wherein the slew rate enhancement unit stops generating the compensation circuit when the voltage difference of the input voltage and the driving voltage is less than a threshold voltage.

12. The driving circuit of claim 1, wherein the slew rate enhancement unit stops generating the compensation circuit when the driving voltage is equal to the input voltage.

13. The driving circuit of claim 1, wherein the operational amplifier has a feedback configuration.

14. The driving circuit of claim 1, wherein the operational amplifier comprises an input stage and an output stage such that the compensation current is inputted to the input stage of the operational amplifier for enhancing a slew rate of the input stage.

15. A method of enhancing response speed of an operational amplifier, the operational amplifier utilized for generating a driving voltage according to an input voltage, the method comprising:

receiving the input voltage and the driving voltage; and adjusting operating characteristics of the operational amplifier by generating a compensation current to the operational amplifier to enlarge a bias current of the operational amplifier according to a voltage difference between the input voltage and the driving voltage when variation of the input voltage occurs.

16. The method of claim 15, wherein the operational amplifier is a rail-to-rail operational amplifier, and comprises a P-type differential pair and an N-type differential pair.

17. The method of claim 16 further comprising:

generating the compensation current to the P-type differential pair to enlarge a bias current of the P-type differential pair according to the voltage difference between the input voltage and the driving voltage when the input voltage rises.

18. The method of claim 16 further comprising:

generating the compensation current to the N-type differential pair to enlarge a bias current of the N-type differential pair according to the voltage difference between the input voltage and the driving voltage when the input voltage descends.

19. The method of claim 15 further comprising:

stopping generation of the compensation circuit when the voltage difference of the input voltage and the driving voltage is less than a threshold voltage.

20. The method of claim 15 further comprising:

stopping generation of the compensation circuit when the driving voltage is equal to the input voltage.

21. The method of claim 15, wherein the operational amplifier comprises an input stage and an output stage, the method further comprising:

inputting the compensation current to the input stage of the operational amplifier for enhancing a slew rate of the input stage.

* * * * *